United States Patent [19]
Marietta et al.

[11] Patent Number: 5,778,415
[45] Date of Patent: *Jul. 7, 1998

[54] APPARATUS, SYSTEMS AND METHODS FOR CONTROLLING ELECTRONIC MEMORIES

[75] Inventors: Bryan Dale Marietta, Dallas; Douglas Arnold Oppedahl, Garland, both of Tex.

[73] Assignee: Hewlett-Packard Co., Palo Alto, Calif.

[*] Notice: The term of this patent shall not extend beyond the expiration date of Pat. No. 5,630,086.

[21] Appl. No.: 707,897

[22] Filed: Sep. 12, 1996

Related U.S. Application Data

[63] Continuation of Ser. No. 161,937, Dec. 3, 1993, Pat. No. 5,630,086.
[51] Int. Cl.[6] .............................. G06F 12/02; G06F 9/26
[52] U.S. Cl. .................. 711/5; 711/1; 711/218; 711/219; 341/97; 377/34
[58] Field of Search ................. 395/405, 401, 395/427; 365/239, 230.09, 240; 341/97, 98; 377/34; 711/1, 5, 100, 218, 219

[56] References Cited

U.S. PATENT DOCUMENTS

| | | | |
|---|---|---|---|
| 4,503,490 | 3/1985 | Thompson | 395/553 |
| 4,556,960 | 12/1985 | Cohn et al. | 395/421.08 |
| 4,903,917 | 2/1990 | Wallace et al. | 244/3.21 |
| 5,088,061 | 2/1992 | Golnabi et al. | 365/189.01 |
| 5,115,413 | 5/1992 | Sato et al. | 365/230.09 |
| 5,226,134 | 7/1993 | Aldereguia et al. | 395/405 |
| 5,278,967 | 1/1994 | Curran | 395/405 |
| 5,386,533 | 1/1995 | Morris | 395/430 |
| 5,630,086 | 5/1997 | Marietta et al. | 395/405 |

*Primary Examiner*—Eddie P. Chan
*Assistant Examiner*—Than V. Nguyen

[57] ABSTRACT

Memory control circuitry is provided which includes circuitry for generating a sequence of gray code values. Counter circuitry is coupled to the gray code circuitry and controls the duration of assertion of each of the generated gray code values. Bus circuitry is also coupled to the gray code circuitry for transmitting the gray code values generated by circuitry. Programmable logic array circuitry is also coupled to the bus circuitry for transmitting, receiving and decoding each of the gray code values and providing at least one memory control signal in response.

5 Claims, 2 Drawing Sheets

APPARATUS, SYSTEMS AND METHODS FOR CONTROLLING ELECTRONIC MEMORIES

CROSS REFERENCE TO RELATED APPLICATION(S)

This is a continuation of application Ser. No. 08/161,937 filed on Dec. 8, 1993 which has issued on May 13, 1997 as U.S. Pat. No. 5,630,086.

TECHNICAL FIELD OF THE INVENTION

The present invention relates in general to electronic memories and in particular to apparatus, systems and methods for controlling electronic memories.

BACKGROUND OF THE INVENTION

In high speed multiboard computing systems it is advantageous to minimize the number of signals that must be transmitted from circuit board to circuit board. As an initial matter, by minimizing the number of signals being transferred, the number of required connector pins can physically be minimized. Notwithstanding, even if sufficient connector pins are available, it is still undesirable to use all of the available connector pins for carrying switching signals. Rather, it good design practice to space apart the high speed switching signals across the connector such that crosstalk and noise can be controlled. Further, those pins which are not being used for switching signals can instead be used, such as in the case of motherboard to daughter board connections, as ground pins. By spacing apart the connector pins and using the remaining pins to couple the ground planes in circuit board to circuit board connections, problems with drift in the ground planes towards the power supply can be controlled.

One particular instance when minimization of the signals passing through a connector is highly advantageous is when data is being sent from a motherboard to one or more memory boards employing dynamic random access memories (DRAMs). In this case, the goal is not only to minimize the signals flowing through the connectors but also to support a standard hardware design which will allow for the use of different types of DRAMs having differing operating parameters. For example, one of the major problems in controlling DRAM memory systems is adjusting for differences in device signal to signal timing in order to maximize performance. In the past, system timing was typically varied using signals provided by a control signal generator and discrete gates and delay lines. This method had substantial disadvantages. With each DRAM of differing performance parameters, a new hardware design was required. Further, if the memory devices and the associated control circuitry were on different circuit boards, the number of control signals passing through the connectors became excessive leading to electrical noise problems. Finally, the additional hardware required simply added complexity and cost to the design and took up valuable board space.

Thus, a need has arisen for apparatus, systems and methods for minimizing the number of signals being passed through a connector. Further, a need has arisen for apparatus, systems, and methods providing flexible memory control. Such apparatus, systems and methods would allow for the use of memory devices of varying performance parameters in a single design while minimizing the amount of control hardware required.

SUMMARY OF THE INVENTION

According to one embodiment of the invention, memory control circuitry is provided which includes circuitry for generating a sequence of gray code values. Coupled to the circuitry for generating gray code values is circuitry for controlling the duration of the assertion of each of the gray code values generated. Circuitry for transmitting is provided for transmitting the gray code values provided by the circuitry for generating to circuitry for decoding which decodes each of the gray code values and provides in response at least one memory control signal.

According to another embodiment of the invention, circuitry is provided for reducing the number of signals being passed through a connector coupling first and second circuits. Gray code generation circuitry is provided as part of the first circuit and is operable to generate a timed sequence of gray code states. Decoder circuitry is provided as part of the second circuit and is operable to receive the sequence of gray code states and selectively provide a corresponding sequence of control signals in response.

According to a further embodiment of the invention, a memory system is provided which includes control circuitry and memory circuitry coupled to the control circuitry. The control circuitry includes circuitry operable to generate a clocked sequence of gray code values, circuitry operable to control the duration of each of the gray code values and circuitry operable to generate a memory operation type control signal. The memory circuitry includes at least one memory device and circuitry operable to receive sequence of gray code values and the memory operation type control signal from the control circuitry and generate in response a timed sequence of memory control signals for performing a memory operation in the memory device.

According to an additional embodiment of the present invention, a method is provided for reducing the number of signals being passed through a connector coupling the first and second circuits. The method includes generating a timed sequence of gray code values within the first circuitry, transmitting the sequence of gray code values through the connector and decoding the gray code values within the second circuity to selectively provide a corresponding sequence of control signals in response.

The embodiments of the present invention provide substantial advantages over the prior art. By generating a sequence of gray codes on a first circuitry and passing such codes to a second circuit where they are decoded into control signals, the number of switching signals passing through an intervening connector can be significantly reduced. By reducing the number of switching signals passing through the connector, ground voltage drift and noise can be substantially reduced. Further, when the principles of the present invention are embodied in systems using random access memories, increased flexibility is provided which will allow memory devices of differing performance parameters to be easily designed into the system. In this instance, a stored program can simply be replaced or modified to vary control signal timing as required.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

The principles of the present invention and their advantages are best understood by referring to the illustrated embodiment depicted in FIGS. 1-4 of the drawings, in which like numbers designate like parts.

Figure 1:
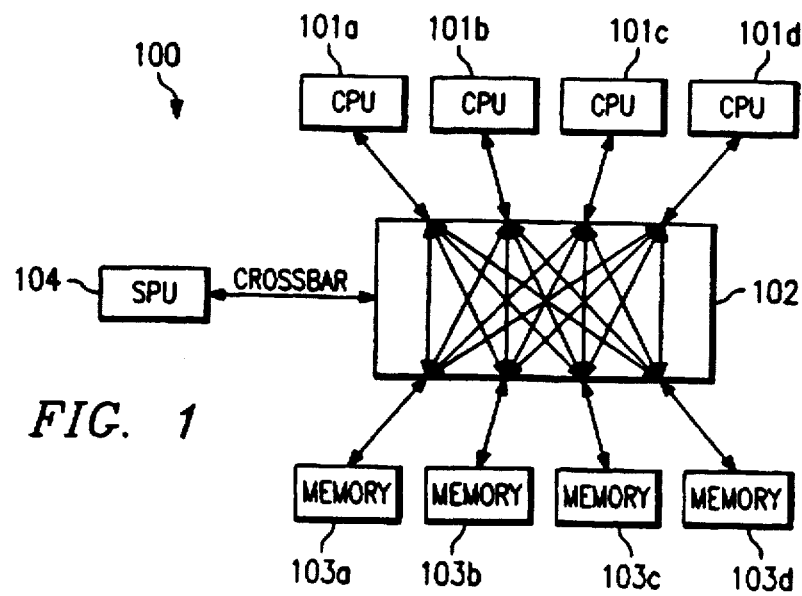
FIG. 1 is a top level functional block diagram of a processing system embodying the principles of the present invention.

FIG. 1 is a functional block diagram of a processing system 100 according to one embodiment of the present invention. Processing system 100 includes a series of parallel central processing units (CPUs) 101a-101d, a crossbar 102, a series of parallel memory units 103a-103d, and a service processor (SPU) 104. In the illustrated embodiment, each central processing unit 101 is a vector processor. Crossbar 102 allows for the selective interconnection of a given one of the central processing units 101 with a given one of the memory units 103. In the illustrated embodiment, crossbar 102 is memory address selective, and each memory unit 103 accommodates a different address range for the storage and retrieval of data. If a given CPU 101 requires the performance of a memory operation, that CPU 101 provides instructions designating a desired operating address space and crossbar 102 analyzes the instructions from the given CPU 101 and then controls the transfer of data to and from the corresponding memory unit 103. Service processor 104 handles such functions as system initialization and fault detection/isolation.

In the illustrated embodiment, a given CPU 101 accesses a corresponding memory unit 103 by transmitting a memory request to crossbar 102. Crossbar 102 then issues a memory request control signals, along with clocks, clock control signals, and scan control signals to the memory units 103. A memory request from the crossbar 102 to the memory units 103 in the illustrated embodiment includes twenty-seven address bits, five bank select bits, a crossbar request bit along with its parity bit, two request type bits, eight zone bits, 64 bits of write data, eight write data parity bits and four control parity bits.

Two bits of the address bits select the memory unit 103 servicing the memory request. The bank select bits designate the data card which will be servicing the memory request. The address bits output from crossbar 102 are also used by the memory board control circuitry (discussed below) of the selected memory unit 103 to generate the required row and column addresses required by the dynamic random access memory devices on the data cards of the selected memory unit 103 (also discussed further below). The crossbar request bit indicates that a memory request is being is being issued by crossbar 102 during the current clock cycle. The request type bits indicate whether the request is for a refresh, read, write or read-modify-write operation. The zone bits are used to define a byte insertion mask for read-modify-write operations and some write operations. In other words, each zone bit designates one byte of the sixty-four bits of data for purposes of writing into memory on a byte by byte basis; all combinations of the zone bits may be used during a read-modify-write and some combinations may be used during a write. One write data parity bit is provided with each of the eight bytes of write data to insure that each byte has an odd parity (giving the overall 8-byte word an even parity). One bit of the control parity bits sets the parity of the eight zone bits and the two request type combined. Two other control parity bits are each used to set the parity of a respective thirteen bits of the twenty-six address bits. One remaining control parity bit is used to set the parity of the bank select bits.

Figure 2:
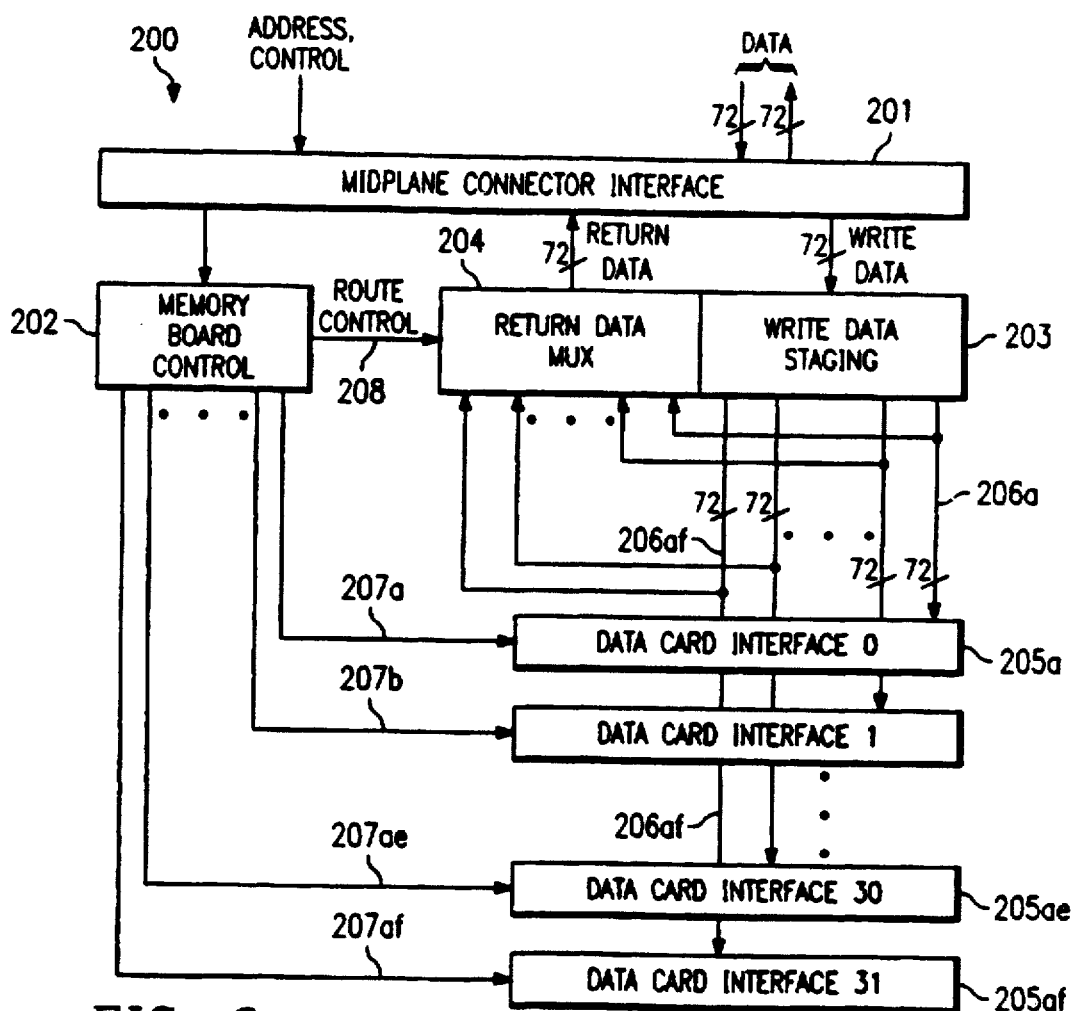
FIG. 2 is a functional block diagram of one of the memory units depicted in FIG. 1.

FIG. 2 is a detailed functional block diagram of the memory board (motherboard) 200 a selected one of the memory units 103a-103d. Memory board 200 includes a midplane connector interface 201 for receiving data, addresses, and control signals from crossbar 102. In the illustrated embodiment, data is received as 72-bit words which are composed of eight 8-bit bytes data and eight corresponding parity bits (one parity bit per byte of data). Address and control signals from crossbar 102 are routed to memory board control circuitry 202 via midplane connector interface 201. Data being routed from and to crossbar 102 through midplane connector 201 are controlled by write staging circuitry 203 and return data multiplexing 204, respectively. Each memory board 200 also includes thirty-two (32) interface units 205 for receiving data cards (daughter boards or cards). These data cards will be discussed in further detail below in connection with FIG. 3. Each data card interface 205 is coupled to write data staging circuitry 203 and read data multiplexing circuitry 204 via a respective 72-bit bidirectional bus 206. Thus, in the illustrated embodiment where thirty-two data card interfaces 205 (and correspondingly thirty-two data cards) are employed, there are accordingly thirty-two 72-bit bidirectional buses 206a-206af (a total of 2304 separate lines).

In the illustrated embodiment, write data staging circuitry 203 and return data multiplexing circuitry 204 are together constructed by a series of gate arrays. These gate arrays act in essence like very large demultiplexers capable of handling 72 lines of input and 2304 lines of output, in the case of write staging circuitry 203, and 2304 input lines and 72 output lines in the case of return data multiplexing circuitry 204. Also, in the illustrated embodiment, memory board control circuitry 202 is constructed of thirty-two individual controllers, each one dedicated to a corresponding data card interface 205 through a corresponding bus 207a-207af.

Memory board control circuitry 202 is coupled to return data multiplexing circuitry 204 and write data staging circuitry 203 via a bus 208. Memory board control circuitry 202 handles data requests from a given CPU 101 as directed via crossbar 102. Memory board controller 202 then provides the appropriate addresses and control signals to the selected memory card 205 to perform a write into the associated data card through the associated data card interface 205 using write data staging circuitry 203, a read from the selected memory card through the corresponding data card interface 205 using return data multiplexing circuitry 204, or a read-modify-write.

Figure 3:
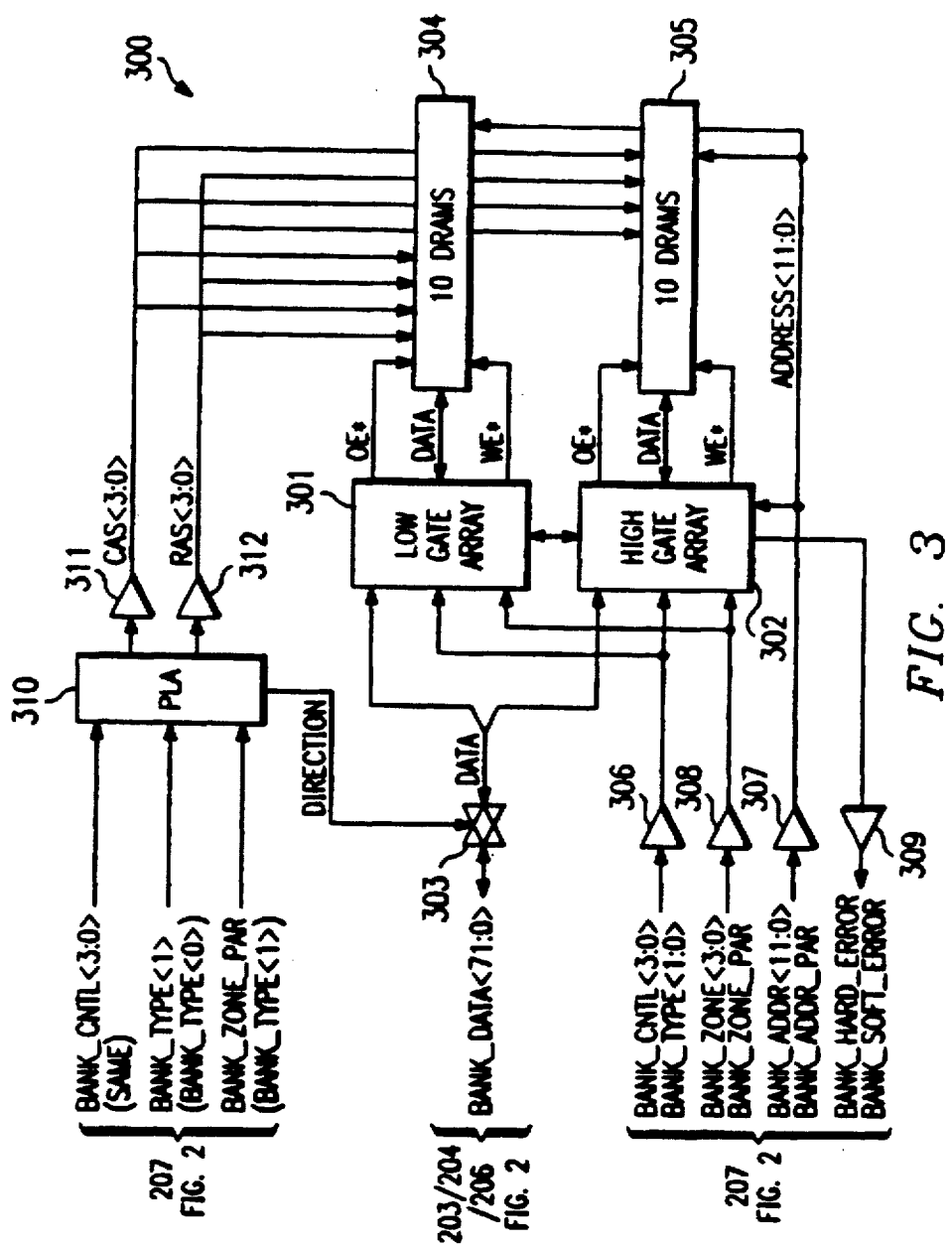
FIG. 3 is a functional block diagram of a data card insertable in a selected one of the data card interfaces depicted in FIG. 2.

Referring next to FIG. 3, a functional block diagram depicts the primary components of a data (memory) card 300. One data card 300 is provided for each data card interface 205 depicted in FIG. 2. Data card 300 includes a low gate array 301 and a high gate array 302. Low gate array 301 controls the transfer of the low 36-bits of data and associated parity bits of the 72-bits received by bidirectional port/drivers 303 (BANK_DATA<71:0>) to bank 304 of memory devices. As discussed further below, low gate array 301 also generates the output enable signal (OE*) and write enable (WE*) for reading and writing data into and out of memory bank 304. Similarly, gate array 302 is operable to selectively transfer the high 36-bits Of data from bi-directional port/drivers 303 to an associated bank of memory devices 305. Gate array 302 also generates the necessary output enable (OE*) and write enable (WE*) signals for memory bank 305.

In a preferred embodiment, gate arrays 301 and 302 are CMOS gate arrays having bi-directional ports for communicating with memory banks 304 and 305. As discussed in further detail below, gate arrays 301 and 302 generate the required output enable and write enable signals in response to a series of gray codes (BANK_CNTL<3:0>) and operation type designator bits (BANK_TYPE<1:0>) received from memory board controller 202 (FIG. 2) through translator/driver 306. In general, the sequences of gray codes (BANK_CNTL<3:0>) control the generation of the required memory control signals by gate arrays 301 and 302 and PAL 310 (discussed further below) for a given type of memory operation. The operations type signal (BANK_TYPE<1:0>) indicates the type of memory operation to be performed which in the illustrated embodiment may be a write, a read, a read-modify-write or a refresh operation.

In the illustrated embodiment, memory device banks 304 and 305 are each constructed from ten dynamic random access memory devices (DRAMs). The individual DRAM devices may be for example one megabit by four, four megabit by four, or sixteen megabit by four devices. Memory banks 304 and 305 sequentially receive 12-bit row and column addresses BANK_ADDR<11:0> and their associated parity bit BANK_ADDR_PAR through translator/driver 307 from memory board controller 202 of the associated memory unit 103.

Control signal BANK_ZONE<3:0>, along with its associated parity bit BANK_ZONE_PAR, is received through translator/driver 308 and indicates to gate arrays 301 and 302 which bytes of each 64-bit word of data being received at port 303 are to be written into memory during a write operation or a read-modify-write operation. Error signals BANK_HARD_ERROR and BANK_SOFT_ERROR are passed back through translator/driver 309 to the memory board control circuitry 202 of the associated memory unit 103 and indicate whether an error detected on the data card 300 is either an uncorrectable (fatal) error such as a catastrophic failure or a correctable error, such as a single bit inversion.

Each memory card 300 also includes programmable logic array 310. PLA 310 controls the data flow direction through bi-directional port 303, and generates the column address strobe (CAS<3:0>) and row address strobe (RAS<3:0>) signals required by the DRAMs of memory banks 304 and 305 (the column address strobe is asserted for all memory operations except a refresh). During a early control period (discussed further below) of a given request cycle, the four gray code bits (BANK_CNTL<3:0>), bit 1 of the operation type bits (BANK_TYPE<1>) and the bank zone parity bit (BANK_ZONE_PAR) are received by PLA 310. During a late control period (also discussed further below) of a given request cycle, the associated motherboard 200 shifts the data being transmitted across the interface 205 such that PLA 310 then receives at its inputs the four gray code bits (BANK_CNTL<3:0>), and bits 0 and 1 of the operation type bits (BANK_TYPE<0> and BANK_TYPE<1> respectively).

Figure 4:
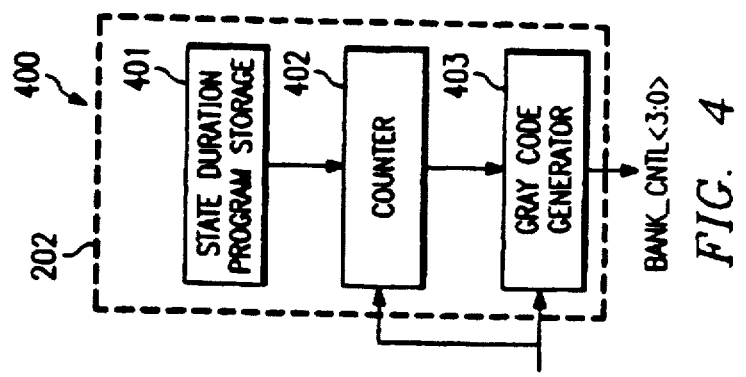
FIG. 4 is a functional block diagram of gray code control circuitry disposed in the memory control circuitry of FIG. 2 according to one embodiment of the present invention.

FIG. 4 is a detailed functional block diagram of memory control signal generation circuitry 400 embodying the principles of the present invention. In the illustrated embodiment, one set of circuitry 400 is found in memory board control circuitry 202 for each data card 300 and corresponding data card interface 205. Circuitry 400 includes state duration program storage 401, a counter 402 and gray code generator 403. Counter 402 and gray code generator 403 operate in conjunction with a high speed clock signal. Each gray code BANK_CNTL<3:0> is used by gate arrays 301 and 302 and PAL 310 to generate the DRAM control signals including the column address strobes, read address strobes, output enable signals and write enable signals required during a corresponding step of a given memory operation. Further, as will be discussed below, the gray codes are also used to control the latching of data, the activation of ports and the execution of error correction/detection operations. Since each step in a given memory operation may require different timing, each gray code (state) will have an active duration time based on the period of high speed clock. Hence, a state duration program is stored in state duration program storage 401 for each memory operations which may be performed, such as read, write, read-modify-write, or refresh. For a given operation, the counter 402 is loaded from state duration program storage 401 with a count value associated with the current gray code state being asserted. In the present, the counter 402 increments up with the high speed clock, and when it reaches zero, causes gray code generator 403 to change the state of the gray code being output as BANK_CNTL<3:0>. A new count is then loaded into counter 402 corresponding to the new gray code state. It should be noted that in alternate embodiments, counter 402 may count down to zero or count (up or down) to an intermediate value before signaling the change to the next gray code state.

Gray code generator 403 in the illustrated embodiment, generates a fourteen state gray code sequence shown in Table 1.

TABLE 1

| State | Gray Code |
|---|---|
| 0 | 0000 |
| 1 | 0001 |
| 3 | 0011 |
| 2 | 0010 |
| 6 | 0110 |
| 7 | 0111 |
| 5 | 0101 |
| 4 | 0100 |
| C | 1100 |
| D | 1101 |
| F | 1111 |
| E | 1110 |
| A | 1010 |
| 8 | 1000 |
| 0 | 0000 |

It should be noted that while the illustrated embodiment uses the fourteen state gray code sequence of Table 1, other gray code sequences, such as a conventional sixteen state gray code sequence, may be used in alternate embodiments. To illustrate the use of a gray code sequence to generate DRAM control signals according to the principles of the present invention, reference is now made to the write memory operation example illustrated in Table 2 (provided at the end of the Detailed Description).

The write operation begins on clock 1 with the transition from gray code state 0000 to gray code state 0001. In the illustrated embodiment, the 0001 gray code state has a two clock cycle duration, although in alternate embodiments, this state can selectively change, as can the duration of any of the gray codes listed in the second column of Table 2, depending on such factors as the type of memory device being used (i.e., different devices may require differing active times be maintained for the various control signals for proper operation). During the gray code state 0001 "drive from bus" goes low such that port/driver 303 and translator/drivers 306–309 are selectively activated to receive data on bus 207 from write data staging circuitry 203 (FIG. 2). At the same time, BANK_ADDR<11:0> represents the row address which is passed to memory banks 304 and 305. The early assertion of the row address in this example allows the row address to be stable before the assertion of the row address strobe (RAS*).

At the transition from gray code state 0001 to state 0011, at clock cycle 3, RAS* is asserted such that the row address is strobed into the DRAMs of banks 304 and 305. It should be noted that in the embodiment depicted in FIG. 3, that there are four RAS lines, each of which drives five DRAM devices. Also during the 0011 state, the "latch early control" signal goes active which latches the row address, its associated parity bit, the operation request type (BANK_TYPE) and the first half of the zone field (BANK_ZONE), into gate arrays 301 and 302. The latched data is preserved for the remainder of the write operation such that it is available in case error correction or logging is required. In the illustrated embodiment, the 0011 gray code state has a period four clock period active duration between clock cycle 3 and clock cycle 6. Finally, during state 0011 the "drive to DRAM" signal switches such that gate arrays 301 and 302 are set to drive data to memory banks 304 and 305.

At the 0011 to 0010 transition occurring with clock cycle 7, the internal latches go transparent such that the "late control data", including the column address and associated parity bits, and the second half of the zone field, are passed through. The second half of the zone field are provided to both gate arrays 301 and 302 while the column address is provided to gate array 302 only. At this time, BANK_ADDR<11:0> represents the column address being presented to the address inputs to the dynamic RAMs in anticipation of the assertion of CAS*. In the illustrated embodiment, the 0010 gray code state has a duration of two clock periods.

At clock period 9 the gray code state makes a transition to 0110 at which time CAS* becomes active thereby strobing in the column address presented on address lines ADDRESS<11:0>. As with the RAS lines, in the illustrated embodiment of FIG. 3, four CAS bits (lines) are provided with one bit (line) controlling five DRAM devices. The 0110 state has a three clock period duration between clocks 9 and 11.

At the transition from state 0110 to 0111 occurring at clock 12, the late control data (i.e., the column address, associated parity bits, and the other half of the zone field) along with the write data are latched in gate arrays 301 and 302 to be preserved for the remainder of the write operation in case error correction or logging is required. The write data is sent on to the DRAMs of banks 304 and 305 through the error correction code generation circuitry which generates error correcting codes stored in DRAMs with write data circuitry of gate arrays 301 and 302. At the same time, the early control data (i.e., the row address, associated parity bits, and the first field of the bank zone) are recaptured in a second set of latches. This re-latching is performed because the first set of latches in the illustrated embodiment go transparent relatively early in the cycle, and a subsequent request for the latched data may cause the early control information to be lost before it can be logged if an error occurs. The 0111 gray code state is active during clock periods 12 and 13 in the illustrated embodiment.

On clock period 14, the 0111 to 0101 transition occurs at which time the write enable (WE*) signal is asserted and the data received through port/drivers 303 is written into the DRAMs.

Next, during clock periods 15 and 16, the 0100 state is presented at which time transceivers/translators of port 303 are stabilized prior to reversing. On transition to state 1100 at clock 17, transceivers/drivers 303 are reversed such that gate arrays 301 and 302 are configured to drive bus 206. The "drive to DRAM" signal remains set for the gate arrays 301 and 302 to drive to memory banks 304 and 305 and consequently no data is transferred from the DRAMs to bus 206. The data on bus 206 is not necessary during a write cycle although it is useful during read and read modify write cycles. In the illustrated embodiment, the 1100 state is preserved during the write cycle such that the system operates identically for all memory operation types as much as possible to simplify the logic design and decrease delay and skew.

During clock cycles 18 through 20, when gray code state 1101 is being asserted, no operation is performed during a write cycle. At clock cycle 21 however, the 1111 gray code state is generated at which time the "errors valid" state is active. The "errors valid" signal indicates that circuitry 300 is stable such that any errors which are detected are valid. If an error is detected, the internal state of gate arrays 301 and 302 is captured in latches and held until a clock edge occurs and captures the state in internal log registers.

With the transition to state 1110 at clock cycle 22, DRAM control signals RAS*, CAS* and WE* are deasserted. Then, at clock cycle 23, the transition is made to gray code state 1010 at which time drivers 303 are shut off and the drive from gate arrays 301 and 302 to the DRAMs is reversed in preparation to receive next memory request. The transition to state 1000 at clock cycle 24 does not initiate an operation during a write cycle and at clock 25 the write cycle is complete.

The principles of the present invention can also be used to generate the required DRAM control signals and latch data as required for read operations, read-modify-write operations, and refresh operations. In each of these cases, the functions (i.e., the assertions and deassertions of control signals) are essentially the same as in the write case. The function performed by a given gray code state however will differ since gate arrays 301 and 302 and PAL 310 will interpret the received gray codes BANK_CNTL in response to the operation type indicated by BANK_TYPE. Again, the number of clock periods a given gray code state remains active is a function of the type of memory devices used, and the internal timing of gate arrays 301 and 302 and PAL 310; the duration of a given gray code state is set to be long enough such that the resulting control signals have a sufficient active state to perform their function. It should be recognized that some operations corresponding to given gray code states, which were required during the write cycle, may not be required in a read, refresh or read-modify-write cycle.

In sum, by generating a sequence of gray codes on one board and passing such codes to a second board where they are decoded into control signal substantial advantages are obtained. Specifically, the number of switching signals through the intervening connector can be significantly reduced thereby helping control ground drift and noise. Further, in embodiments such as those illustrated herein where dynamic random access memories are being employed, increase flexibility has been provided which will allow memory devices of varying performance parameters to be easily designed into a system. In this case, the stored program can simply be replaced or modified to vary the control signal timing as required.

Although the present invention and its advantages have been described in detail, it should be understood that various changes, substitutions and alterations can be made herein without departing from the spirit and scope of the invention as defined by the appended claims.

TABLE 2

Table 3–21 code and signal sequence for a Write

| clock | code | RAS | CAS* | OE* | WE* | latch early cntl | latch late cntl | drive from bus | drive to bus | drive to DRAM | errors valid |
|---|---|---|---|---|---|---|---|---|---|---|---|
| 0 | 0000 | 1 | 1 | 1 | 1 | 0 | 1 | 1 | 1 | 1 | 0 |
| 1 | 0001 | 1 | 1 | 1 | 1 | 0 | 1 | 0 | 1 | 1 | 0 |
| 2 | 0001 | 1 | 1 | 1 | 1 | 0 | 1 | X | 1 | 1 | 0 |
| 3 | 0011 | 0 | 1 | 1 | 1 | 1 | 1 | X | 1 | 0 | 0 |
| 4 | 0011 | 0 | 1 | 1 | 1 | 1 | 1 | X | 1 | 0 | 0 |
| 5 | 0011 | 0 | 1 | 1 | 1 | 1 | 1 | X | 1 | 0 | 0 |
| 6 | 0011 | 0 | 1 | 1 | 1 | 1 | 1 | X | 1 | 0 | 0 |
| 7 | 0010 | 0 | 1 | 1 | 1 | 1 | 0 | X | 1 | 0 | 0 |
| 8 | 0010 | 0 | 1 | 1 | 1 | 1 | 0 | X | 1 | 0 | 0 |
| 9 | 0110 | 0 | 0 | 1 | 1 | 1 | 0 | X | 1 | 0 | 0 |
| 10 | 0110 | 0 | 0 | 1 | 1 | 1 | 0 | X | 1 | 0 | 0 |
| 11 | 0110 | 0 | 0 | 1 | 1 | 1 | 0 | X | 1 | 0 | 0 |
| 12 | 0111 | 0 | 0 | 1 | 1 | 1 | 1 | X | 1 | 0 | 0 |
| 13 | 0111 | 0 | 0 | 1 | 1 | 1 | 1 | X | 1 | 0 | 0 |
| 14 | 0101 | 0 | 0 | 1 | 0 | 1 | 1 | X | 1 | 0 | 0 |
| 15 | 0100 | 0 | 0 | 1 | 0 | 1 | 1 | X | 1 | 0 | 0 |
| 16 | 0100 | 0 | 0 | 1 | 0 | 1 | 1 | X | 1 | 0 | 0 |
| 17 | 1100 | 0 | 0 | 1 | 0 | 1 | 1 | X | 0 | 0 | 0 |
| 18 | 1101 | 0 | 0 | 1 | 0 | 1 | 1 | X | 0 | 0 | 0 |
| 19 | 1101 | 0 | 0 | 1 | 0 | 1 | 1 | X | 0 | 0 | 0 |
| 20 | 1101 | 0 | 0 | 1 | 0 | 1 | 1 | X | 0 | 0 | 0 |
| 21 | 1111 | 0 | 0 | 1 | 0 | 1 | 1 | X | 0 | 0 | 1 |
| 22 | 1110 | 1 | 1 | 1 | 1 | 1 | 1 | X | 0 | 0 | 1 |
| 23 | 1010 | 1 | 1 | 1 | 1 | 1 | 1 | X | 0 | 1 | 1 |
| 24 | 1000 | 1 | 1 | 1 | 1 | 1 | 1 | X | 0 | 1 | 1 |
| 25 | 0000 | 1 | 1 | 1 | 1 | 0 | 1 | 1 | 1 | 1 | 0 |

What is claimed is:

1. A method of generating memory control signals comprising the steps of:

generating a sequence of gray code values;

generating an operation type signal;

selectively controlling the duration of assertion of each of said gray code values;

transmitting said gray code values and said operation type signal;

receiving said sequence of gray codes and said operation type signal by gate array circuitry and generating in response a first selected one of a timed sequence of operation type signals; and receiving said sequence of gray codes and said operation type signal by programmable array logic and generating in response a second selected one of said timed sequence of operation type signals.

2. The method of claim 1 wherein said step of selectively controlling comprises the substeps of:

holding a preselected initial counter value in storage;

incrementing the initial counter value received from storage using a counter with each period of a received clock signal; and generating a new gray code value when the counter increments to a preselected new value.

3. The method of claim 1 wherein the operation type signals comprise dynamic random access memory control signals.

4. A method for reducing the number of signals being passed through a connector coupling first and second circuits, the first and second circuits disposed on first and second boards, respectively, said method comprising the steps of:

generating a timed sequence of gray code states with said first circuit;

generating a memory control signal with said first circuit;

receiving said sequence of gray codes and said memory control signal by said second circuit and generating, in response, a first selected one of a timed sequence of memory control signals; and receiving said sequence of gray codes and said memory control signal by said second circuit and generating, in response, a second selected one of said timed sequence of memory control signals.

5. The method of claim 4 wherein said step of generating a timed sequence of gray codes comprises the steps of:

storing a preselected initial counter value;

incrementing the initial counter value received from storage using a counter to generate a sequence of new counter values; and providing a next gray code value in the sequence in response to a selected one of the sequence of new counter values.

* * * * *